United States Patent
Cook et al.

(10) Patent No.: US 11,495,433 B1
(45) Date of Patent: Nov. 8, 2022

(54) CHARGED PARTICLE BEAM APPARATUS, MULTI-BEAMLET ASSEMBLY, AND METHOD OF INSPECTING A SPECIMEN

(71) Applicant: ICT Integrated Circuit Testing Gesellschaft für Halbleiterprüftechnik mbH, Heimstetten (DE)

(72) Inventors: Benjamin John Cook, Munich (DE); Dieter Winkler, Munich (DE); Markus Thomann, Poing (DE); Thomas Kemen, Meppen (DE); Roman Barday, Poing (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 17/231,585

(22) Filed: Apr. 15, 2021

(51) Int. Cl.
*H01J 37/28* (2006.01)
*H01J 37/317* (2006.01)
(Continued)

(52) U.S. Cl.
CPC ............ *H01J 37/28* (2013.01); *H01J 37/045* (2013.01); *H01J 37/09* (2013.01); *H01J 37/14* (2013.01);
(Continued)

(58) Field of Classification Search
CPC .. H01J 37/00; H01J 37/02; H01J 37/28; H01J 37/26; H01J 37/045; H01J 37/09;
(Continued)

(56) References Cited

U.S. PATENT DOCUMENTS 9,922,796 B1 * 3/2018 Frosien ................. H01J 37/153
10,176,965 B1 * 1/2019 Breuer .................... H01J 37/10
(Continued)

*Primary Examiner* — Jason L McCormack
(74) *Attorney, Agent, or Firm* — Kilpatrick Townsend & Stockton LLP

(57) ABSTRACT

A charged particle beam apparatus for inspecting a specimen with a plurality of beamlets is described. The charged particle beam apparatus includes a charged particle beam emitter (105) for generating a charged particle beam (11) propagating along an optical axis (A) and a multi-beamlet generation- and correction-assembly (120), including a first multi-aperture electrode (121) with a first plurality of apertures for creating the plurality of beamlets from the charged particle beam, at least one second multi-aperture electrode (122) with a second plurality of apertures of varying diameters for the plurality of beamlets for providing a field curvature correction, and a plurality of multipoles (123) for individually influencing each of the plurality of beamlets, wherein the multi-beamlet generation- and correction-assembly (120) is configured to focus the plurality of beamlets to provide a plurality of intermediate beamlet crossovers. The charged particle beam apparatus further includes an objective lens (150) for focusing each of the plurality of beamlets to a separate location on the specimen, and a single transfer lens (130) for beamlet collimation arranged between the multi-beamlet generation- and correction-assembly and the objective lens. Further, a method of inspecting a specimen with a charged particle beam apparatus is described.

18 Claims, 4 Drawing Sheets

(51) Int. Cl.
*H01J 37/153* (2006.01)
*H01J 37/14* (2006.01)
*H01J 37/147* (2006.01)
*H01J 37/04* (2006.01)
*H01J 37/09* (2006.01)

(52) U.S. Cl.
CPC ........ *H01J 37/1477* (2013.01); *H01J 37/153* (2013.01); *H01J 37/3177* (2013.01); *H01J 2237/049* (2013.01); *H01J 2237/0453* (2013.01); *H01J 2237/1516* (2013.01); *H01J 2237/2817* (2013.01)

(58) Field of Classification Search
CPC ...... H01J 37/14; H01J 37/1477; H01J 37/153; H01J 37/3177; H01J 37/10; H01J 2237/0453; H01J 2237/049; H01J 2237/1516; H01J 2237/2817
USPC .............................. 250/306, 307, 311, 396 R
See application file for complete search history.

(56) References Cited

U.S. PATENT DOCUMENTS

| | | | |
|---|---|---|---|
| 2004/0036030 A1* | 2/2004 | Matsuya ............... | H01J 37/153 250/396 R |
| 2013/0248731 A1* | 9/2013 | Tanimoto .............. | H01J 37/153 250/396 R |
| 2019/0035595 A1* | 1/2019 | Ren ......................... | H01J 37/05 |
| 2019/0066972 A1* | 2/2019 | Frosien .................. | H01J 37/09 |
| 2020/0381211 A1* | 12/2020 | Ren ......................... | H01J 37/09 |
| 2020/0411280 A1* | 12/2020 | Noda .................... | H01J 37/261 |

\* cited by examiner

CHARGED PARTICLE BEAM APPARATUS, MULTI-BEAMLET ASSEMBLY, AND METHOD OF INSPECTING A SPECIMEN

TECHNICAL FIELD

Embodiments described herein relate to charged particle beam apparatuses, for example, for inspection system applications, testing system applications, defect review or critical dimensioning applications or the like. Embodiments also relate to methods of operating a charged particle beam apparatus and to methods of inspecting a specimen with a plurality of beamlets. More particularly, embodiments relate to charged particle beam apparatuses being multi-beam systems for general purposes (such as imaging biological structures) and/or for high throughput EBI (electron beam inspection). Specifically, embodiments relate to a scanning electron microscope and to methods of electron beam inspection with a scanning electron microscope.

BACKGROUND

Modern semiconductor technology is highly dependent on an accurate control of the various processes used during the production of integrated circuits. Accordingly, the wafers are inspected repeatedly in order to localize problems as early as possible. Furthermore, a mask or reticle is also inspected before the actual use during wafer processing in order to make sure that the mask accurately defines the respective pattern. The inspection of wafers or masks for defects may include the examination of the whole wafer or mask area. Especially, the inspection of wafers during the fabrication includes the examination of the whole wafer area in such a short time that production throughput is not limited by the inspection process.

Scanning electron microscopes (SEM) have been used to inspect wafers and other specimens. The surface of the wafer is scanned using e.g. a finely focused electron beam. When the electron beam hits the wafer, secondary electrons and/or backscattered electrons, i.e. signal electrons, are generated and measured. A pattern defect at a location on the wafer can be detected by comparing an intensity signal of the secondary electrons with, for example, a reference signal corresponding to the same location on the pattern. However, because of the increasing demands for higher resolutions, scanning the entire surface of the wafer takes a long time. Accordingly, using a conventional (single-beam) Scanning Electron Microscope (SEM) for wafer inspection is difficult, since the approach does not provide the respective throughput.

One approach to solve such problems is the use of multiple beams (also referred to herein as "beamlets") in a single column. Directing, scanning, deflecting, shaping, correcting, and/or focusing individual beamlets of a multi-beam system is, however, challenging, in particular when sample structures are to be scanned and inspected in a quick manner with a high throughput on a nanoscale resolution. For example, correcting aberrations, such as a field curvature, of multiple beams in a single column is challenging.

Further, if multiple beams propagate next to each other over an extended distance within a column of a charged particle beam apparatus, electron-electron-interaction (e-e-interaction) within one beamlet and/or e-e-interaction between adjacent beamlets may cause aberrations, such as beam widening or deflection, deteriorating the achievable resolution. It is therefore challenging to provide a charged particle beam apparatus that allows an inspection of a specimen with multiple beamlets at a high resolution.

In view of the above, a charged particle beam apparatus and a method of inspecting a specimen with a plurality of beamlets of charged particles is to be provided that overcome at least some of the problems in the art. Specifically, a charged particle beam apparatus is to be provided that allows a quick inspection of a specimen with a plurality of beamlets of charged particles while reducing beamlet aberrations and other undesired effects caused by electron-electron interaction, improving the achievable resolution.

SUMMARY

In light of the above, a charged particle beam apparatus for inspecting a specimen with a plurality of beamlets of charged particles, a multi-beamlet assembly for use in a charged particle beam apparatus, and a method of inspecting a specimen with a plurality of beamlets of charged particles according to the independent claims are provided. Further aspects, advantages, and features are apparent from the dependent claims, the description, and the accompanying drawings.

According to an aspect, a charged particle beam apparatus for inspecting a specimen with a plurality of beamlets of charged particles is provided. The charged particle beam apparatus includes a charged particle beam emitter for generating a charged particle beam propagating along an optical axis, and a multi-beamlet generation- and correction-assembly, including: a first multi-aperture electrode with a first plurality of apertures for creating the plurality of beamlets from the charged particle beam; at least one second multi-aperture electrode with a second plurality of apertures of varying diameters for the plurality of beamlets for providing a field curvature correction; and a plurality of multipoles for individually influencing each of the plurality of beamlets, wherein the multi-beamlet generation- and correction-assembly is configured to focus the plurality of beamlets to provide a plurality of intermediate beamlet crossovers. The charged particle beam apparatus further includes an objective lens for focusing each of the plurality of beamlets to a separate location on the specimen; and a single transfer lens for beamlet collimation arranged between the multi-beamlet generation- and correction-assembly and the objective lens.

In some embodiments, each of the plurality of beamlets may have only one beamlet crossover between the multi-beamlet generation- and correction-assembly and the objective lens that is generated due to the focusing effect of the multi-beamlet generation- and correction-assembly.

According to an aspect, a multi-beamlet assembly for use in a charged particle beam apparatus is provided. The multi-beamlet assembly includes a field curvature corrector having a plurality of apertures of varying diameters for a plurality of beamlets of charged particles, the field curvature corrector configured to focus each of the plurality of beamlets to provide a plurality of intermediate beamlet crossovers, a single transfer lens for beamlet collimation arranged downstream of the plurality of intermediate beamlet crossovers, and an objective lens for focusing each beamlet of the plurality of beamlets to a separate location on a specimen.

According to an aspect, a method of inspecting a specimen with a plurality of beamlets of charged particles is provided. The method includes generating a charged particle beam propagating along an optical axis, creating the plurality of beamlets from the charged particle beam, compensating a field curvature by focusing the plurality of beamlets with a multi-aperture electrode having a plurality of apertures with varying diameters, individually influencing the plurality of beamlets with a plurality of multipoles, collimating the plurality of beamlets with a single transfer lens, and focusing the plurality of beamlets on separate locations of the specimen with an objective lens to simultaneously inspect the specimen at the separate locations.

In some embodiments, the plurality of beamlets are directed through an essentially coma-free point of the objective lens.

Embodiments are also directed at apparatuses for carrying out the disclosed methods and include apparatus parts for performing each described method feature. The method features may be performed by way of hardware components, a computer programmed by appropriate software, by any combination of the two or in any other manner. Furthermore, embodiments are also directed at methods with which the described apparatus operates. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION OF EMBODIMENTS

Figure 1:
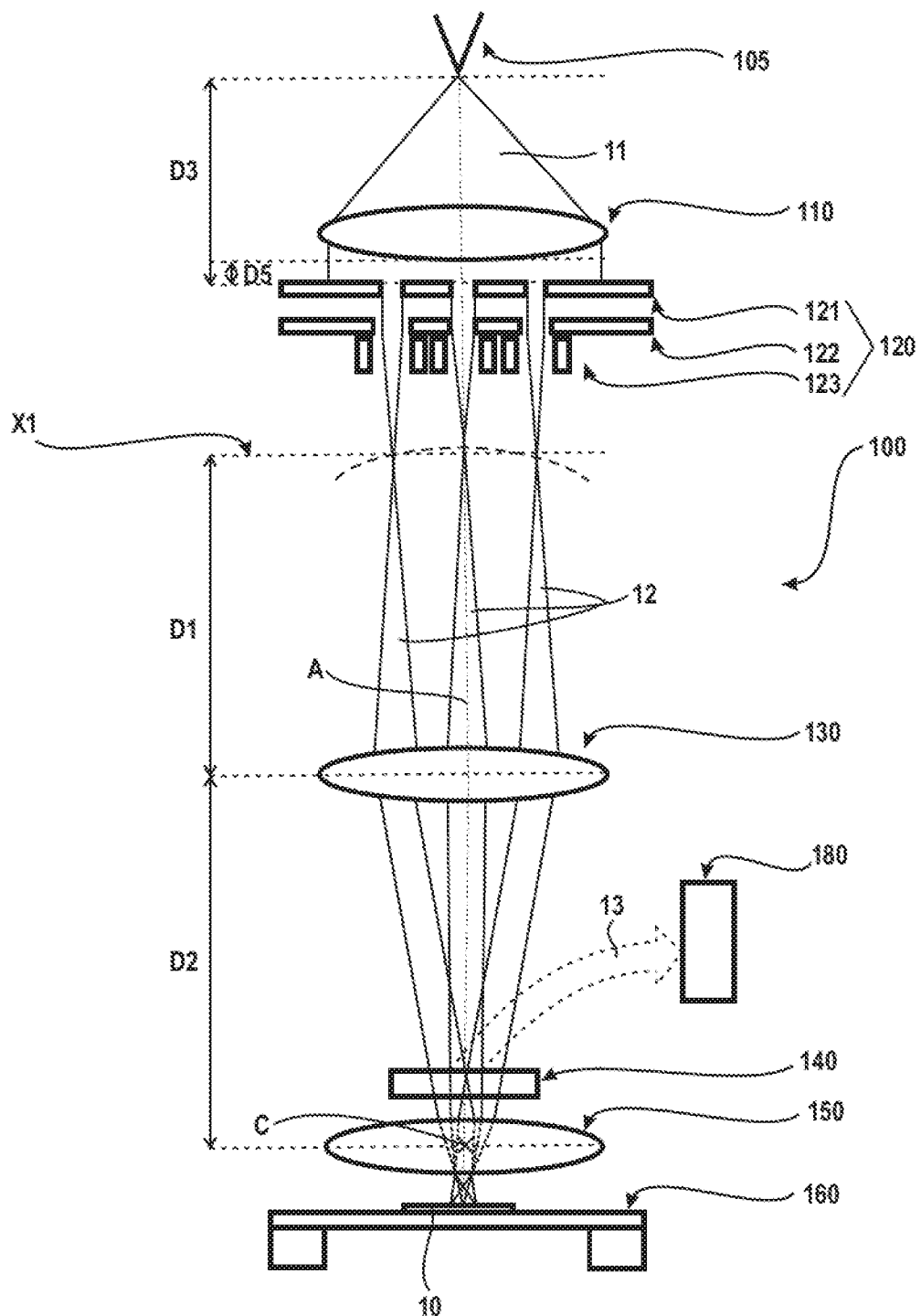
FIG. 1 shows a schematic view of a charged particle beam apparatus according to embodiments described herein.

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of the present application, in the following the charged particle beam apparatuses or components thereof will exemplarily be referred to as charged particle beam apparatuses for the detection of secondary and/or backscattered electrons. Embodiments can still be applied for apparatuses and components detecting corpuscles, such as secondary and/or backscattered ions in order to obtain a specimen image. As described herein, discussions and descriptions relating to the detection are exemplarily described with respect to electrons in scanning electron microscopes. Other types of charged particles, e.g. positive ions, could be detected by the apparatus in a variety of different instruments.

A "specimen" or "sample" as referred to herein includes, but is not limited to, semiconductor wafers, semiconductor workpieces, photolithographic masks and other workpieces such as memory disks and the like. Embodiments may be applied to any workpiece on which material is deposited or which is structured. A specimen may include a surface to be structured or on which layers are deposited, an edge, and/or a bevel. According to some embodiments, which can be combined with other embodiments described herein, the apparatus and methods are configured for or are applied for electron beam inspection, for critical dimensioning applications and defect review applications.

Scanning electron microscopes (SEMs) can be used to inspect a specimen to detect defects such as pattern defects. The surface of the specimen is scanned using a charged particle beam, e.g. an electron beam, which may be focused on the surface of the specimen. When the charged particle beam hits the specimen, signal particles, particularly secondary and/or backscattered particles (e.g., secondary and/or backscattered electrons) are generated and detected. Pattern defects at a location of the specimen can be detected. When only one charged particle beam is used for scanning, scanning may take a considerable amount of time, and only a limited throughput may be obtainable.

The throughput may be increased by providing a charged particle beam apparatus configured as a multi-beam apparatus. In a multi-beam apparatus, a plurality of beamlets of charged particles are generated which propagate next to each other in a column so that two or more spots on the specimen can be inspected simultaneously. However, controlling, shaping and correcting a plurality of beamlets which propagate at a close relative distance in one column is challenging. According to embodiments described herein, a charged particle beam apparatus is provided which provides a high throughput and a high inspection accuracy at the same time.

An embodiment of a charged particle beam apparatus 100 is schematically shown in FIG. 1. The charged particle beam apparatus 100 includes a charged particle beam emitter 105 for generating a charged particle beam 11 propagating along an optical axis A. The charged particle beam emitter 105 may be an electron source configured to generate an electron beam. Alternatively, the charged particle beam emitter may be an ion source configured to generate an ion beam. The charged particle beam 11 may propagate from the charged particle beam emitter 105 toward a specimen 10 through a column along the optical axis A. The specimen 10 may be placed on a specimen stage 160 which may be movable, particularly in the direction of the optical axis A and/or in the plane of the specimen, also referred to herein as the x-y-plane.

A plurality of beam influencing elements such as one or more deflectors, beam correctors, lenses, apertures, beam benders and/or beam separators may be arranged along the beam path between the charged particle beam emitter 105 and the specimen 10. In particular, a condenser lens 110 may be arranged downstream of the charged particle beam emitter 105 for collimating the charged particle beam 11, and an objective lens 150 for beam focusing on the specimen may be arranged downstream of the condenser lens 110 and upstream of the specimen.

Figure 2:
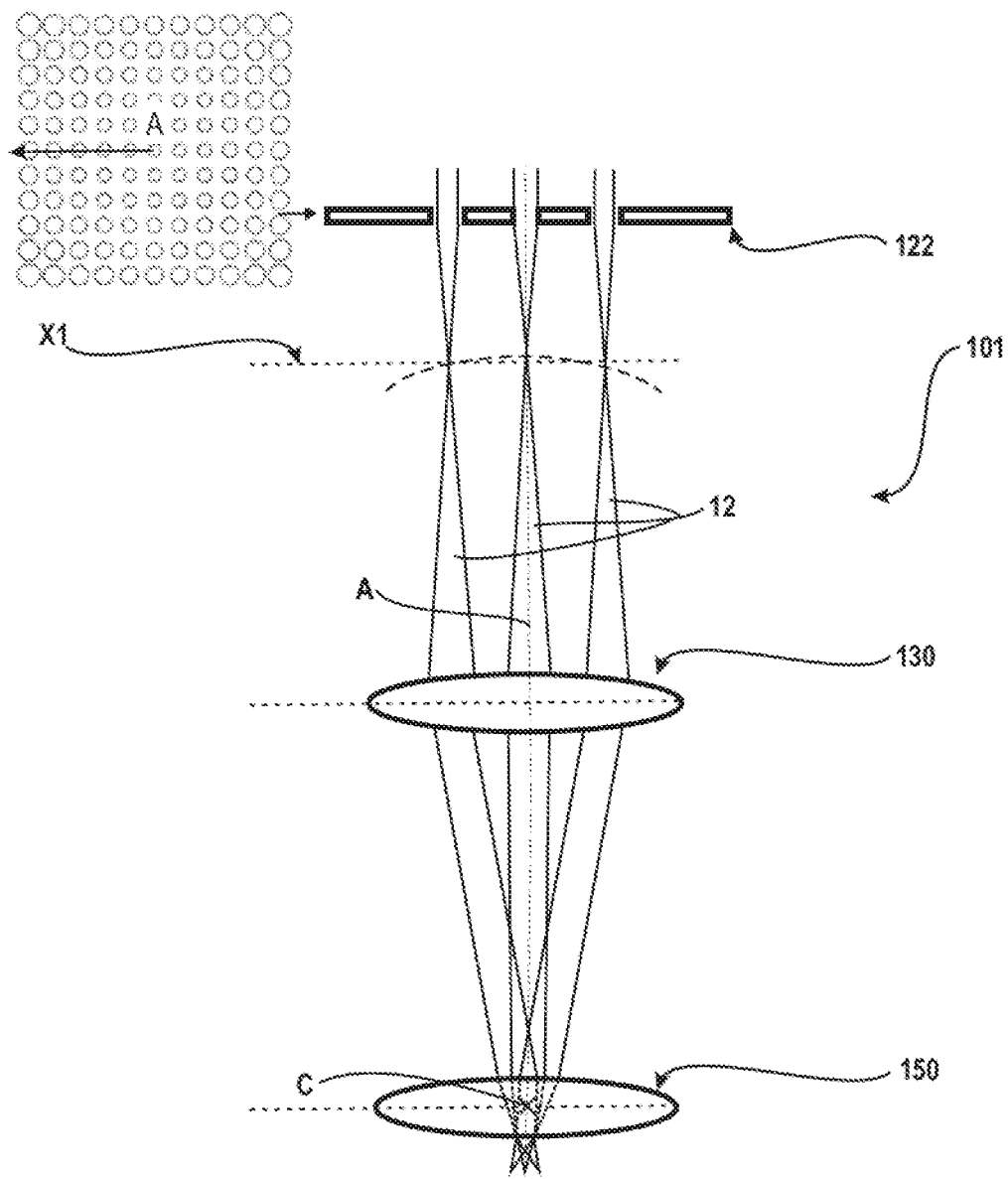
FIG. 2 shows a schematic view of a multi-beamlet assembly for use in a charged particle beam apparatus according to embodiments described herein.
Figure 3:
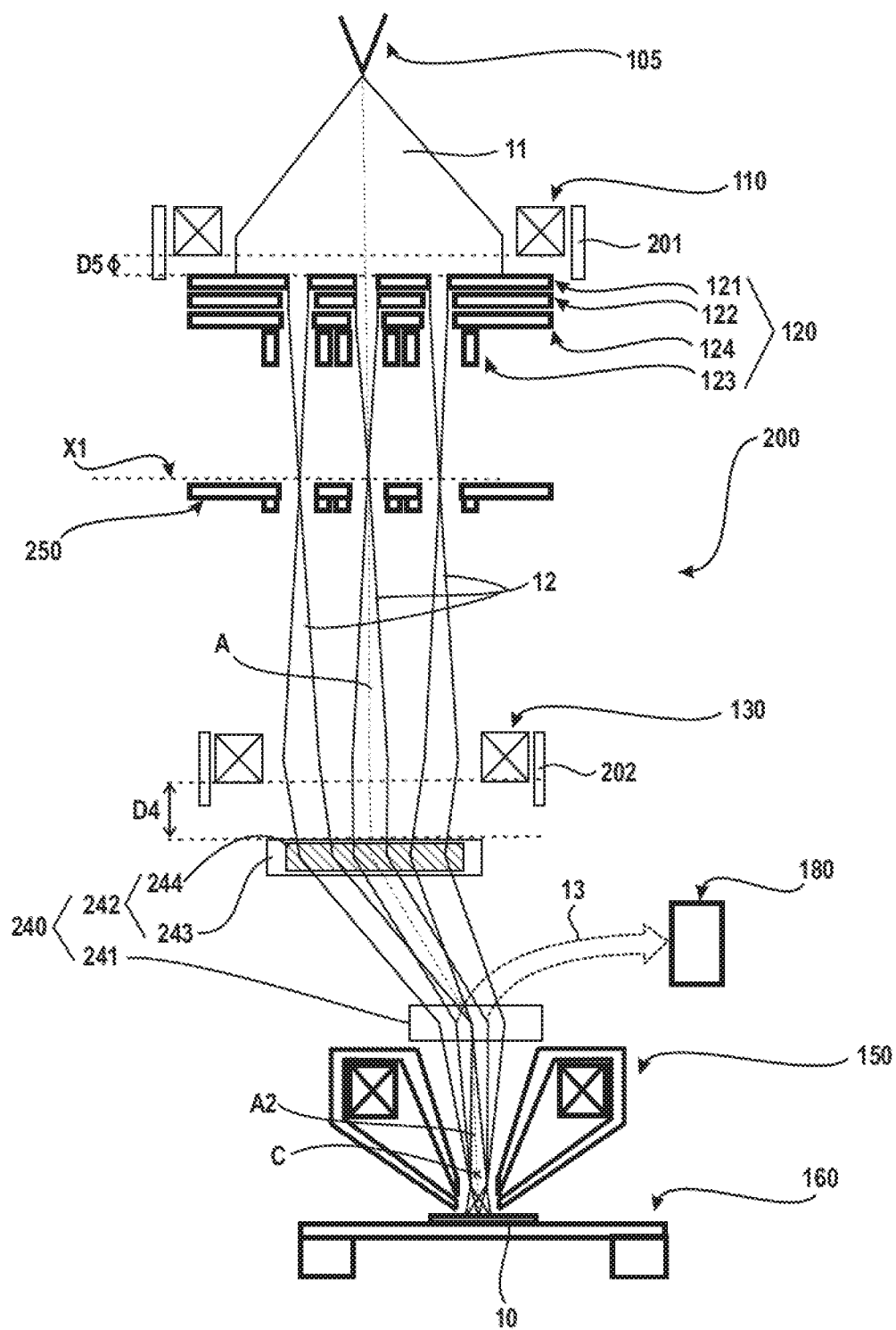
FIG. 3 shows a schematic view of a charged particle beam apparatus according to embodiments described herein.

In FIGS. 1 and 2, the lenses are schematically illustrated as "optical" lenses by oval shapes. However, it is to be understood that the lenses may typically be at least one of magnetic lenses, electrostatic lenses or combined magnetic-electrostatic lenses configured to have a focusing effect on a charged particle beam, as illustrated in FIG. 3. "Downstream" as used herein may generally be understood as downstream along the propagation direction of the charged particles from the charged particle beam emitter 105 toward the specimen 10.

In some embodiments, the charged particle beam emitter 105 may include at least one of a cold field emitter (CFE), a Schottky emitter, a thermal field emitter (TFE) or another high current electron beam source, in order to increase the throughput. A high current is considered to be 10 μA in 100 mrad or more, for example up to 5 mA, e.g. 30 μA in 100 mrad to 1 mA in 100 mrad. According to typical implementations, the current is distributed essentially uniformly, e.g. with a deviation of +/−10%. According to some embodiments, which can be combined with other embodiments described herein, the charged particle beam emitter can have a diameter of 2 nm to 40 nm and/or have a typical emission half angle of 5 mrad or above, e.g. 50 mrad to 200 mrad.

The charged particle beam apparatus 100 includes a multi-beamlet generation- and correction-assembly 120 for generating and correcting a plurality of beamlets 12 from the charged particle beam 11. The multi-beamlet generation- and correction-assembly 120 includes a first multi-aperture electrode 121 with a plurality of apertures for creating the plurality of beamlets 12 from the charged particle beam 11. The first multi-aperture electrode may be configured as a plate with an array of apertures formed therein, the array of apertures configured to create the plurality of beamlets 12. For example, a one-dimensional or two-dimensional array of apertures may be formed in the first multi-aperture electrode 121. In particular, the first multi-aperture electrode 121 may have three, ten, forty or more apertures configured to create three, ten, forty or more beamlets. The apertures may be arranged in one or more rows of apertures, for example to provide a tessellation pattern of beamlets in a plane perpendicular to the optical axis A. If one or more rows of apertures for creating one or more rows of beamlets are provided, the pitch between adjacent apertures of one row may be equal, respectively. In particular, the first multi-aperture electrode 121 may have 30, 50 or more apertures for generating 30, 50 or more beamlets. For example, a number between 40 and 130 beamlets may be created. Each of the apertures may be configured to create one beamlet from the charged particle beam. In some embodiments, an array of m×n apertures may be formed in the first multi-aperture electrode 121, m and n being integers of 5 or more, particularly of 8 or more, respectively. The array does not necessarily have a square or rectangular boundary. Rather, an array with a round or circular boundary may be provided, e.g. including a plurality of rows of apertures, wherein the number of apertures per row may vary, for example increase and then decrease in a y-direction, when x corresponds to the row direction. Only three beamlets are exemplarily depicted in the figures.

The first multi-aperture electrode 121 can be set on a predetermined electrical potential. For example, the first multi-aperture electrode 121 may be connected to a ground potential and/or to a column potential.

In some embodiments, the charged particle beam 11 may be accelerated along an acceleration section upstream of the multi-beamlet generation- and correction-assembly 120 to a high beam energy of 30 keV or more (electron energy), particularly 35 keV or more. A high electron energy inside the column may be beneficial because negative effects of electron-electron-interactions can be reduced. For example, the acceleration section may extend between a first electrode (e.g., a beam emitting or beam extraction electrode of the charged particle beam emitter 105) having a potential of −30 kV or less and the first multi-aperture electrode 121 that may be essentially grounded, i.e. provided at a potential of about 0 V, such that the potential difference between the first electrode and the first multi-aperture electrode is 30 kV or more.

The first multi-aperture electrode 121 may include a plate in which the apertures are formed as beam limiting holes. When the charged particle beam 11 impinges on the plate having the apertures formed therein, charged particles can propagate through the apertures in the plate to form the plurality of beamlets, and a remaining part of the charged particle beam may be blocked by the plate. In some embodiments, at least one surface of the first multi-aperture electrode 121, e.g. the surface directed toward the charged particle beam emitter 105, may be a conductor or semiconductor surface in order to reduce or avoid an accumulation of charges.

The multi-beamlet generation- and correction-assembly 120 further includes at least one second multi-aperture electrode 122 with a second plurality of apertures of varying diameters for the plurality of beamlets in order to provide a field curvature correction. In other words, the multi-beamlet generation- and correction-assembly 120 including the at least one second multi-aperture electrode 122 acts as a field curvature corrector that (pre-) compensates a field curvature of the plurality of beamlets, such that each of the plurality of beamlets can be focused by the objective lens in the same plane in which the specimen 10 is located. The at least one second multi-aperture electrode 122 may be arranged downstream of the first multi-aperture electrode 121, and the second plurality of apertures may be aligned with the first plurality of apertures, such that the plurality of beamlets propagate through the first and then through the second pluralities of apertures. Each multi-aperture electrode may be provided as a plate in which a plurality of apertures are formed.

The multi-beamlet generation- and correction-assembly 120 is configured to provide the field curvature correction by focusing the plurality of beamlets to provide a plurality of intermediate beamlet crossovers arranged in an intermediate cross-over plane X1. The intermediate cross-over plane X1 may be a curved plane (as is depicted in FIG. 1), particularly if the multi-beamlet generation- and correction-assembly 120 provides a pre-compensation of the field curvature introduced downstream of the multi-beamlet generation- and correction-assembly 120, e.g. by the objective lens 150 and/or by other beam-optical components. Accordingly, each beamlet can be focused by the objective lens on the surface of the specimen, i.e. in the same flat plane, which means that the plurality of beamlets are essentially free of field curvature at the position of the specimen.

According to some embodiments described herein, the second multi-aperture electrode 122 has a focusing effect on the plurality of beamlets 12, wherein the strength of the focusing effect on each beamlet depends on the size of the respective aperture through which the respective beamlet propagates. The focusing effect of a conventional electrostatic lens configured as an opening in an electrode typically depends on the diameter of the opening which affects the electrical field difference on opposite sides of the electrode. More specifically, an electrode with a small opening typically has a stronger focusing effect on a charged particle beam than an electrode with a larger opening. Accordingly, a multi-aperture electrode having apertures with varying diameters provides varying focusing effects on a plurality of beamlets propagating through the apertures. An increase in diameter of an aperture results in a reduced electrical field strength and hence in a reduced electrical focusing power of the respective lens.

In some embodiments, the second plurality of apertures of the second multi-aperture electrode 122 has diameters that vary as a function of a distance from the optical axis A. In particular, the diameters of the second plurality of apertures increase with an increasing distance from the optical axis A, as is schematically depicted in the figures. Accordingly, a centrally arranged beamlet is focused stronger than an edge beamlet, as it is illustrated in FIG. 1. In other embodiments, the diameters of the second plurality of apertures decrease with an increasing distance from the optical axis A. In yet further embodiments, the diameters of the apertures of the second multi-aperture electrode may vary in another way, e.g. increasing or decreasing from one side of the electrode to another side of the electrode, e.g., in a linear way, or diagonally, which may be beneficial for compensating specific field curvatures that may be introduced by beam-optical components.

The field curvature introduced by the multi-beamlet generation- and correction-assembly 120 may be essentially inverse to the field curvature that is caused by other beam-optical components, e.g. by an objective lens, a condenser lens 110 and/or a transfer lens, such that the beam curvature may be essentially zero at the position of the specimen 10.

The multi-beamlet generation- and correction-assembly 120 further includes a plurality of multipoles 123 for individually influencing each of the plurality of beamlets. The plurality of multipoles 123 may be a plurality of electrostatic multipoles. Each of the beamlets 12 can be individually corrected, adjusted, deflected or otherwise influenced by an associated multipole of the plurality of multipoles 123. Specifically, the plurality of multipoles 123 may include one multipole, particularly an electrostatic octupole, for each of the plurality of beamlets. An electrostatic octupole allows a beamlet deflection or adjustment/alignment, if operated to provide a dipole field with a predetermined selectable deflection direction. An electrostatic octupole also allows a beamlet aberration correction, e.g. if operated to provide a quadrupole field for stigmation correction.

The plurality of multipoles 123 may be arranged between the most downstream multi-aperture electrode of the multi-beamlet generation- and correction-assembly 120 and the plurality of intermediate beamlet crossovers, particularly directly downstream of the most downstream multi-aperture electrode. In the embodiment of FIG. 1, the plurality of multipoles 123 is arranged directly downstream of the at least one second multi-aperture electrode 122. For example, the plurality of multipoles 123 may be arranged on a beam exit surface of the at least one second multi-aperture electrode 122 that is directed toward the plurality of intermediate beamlet crossovers. In the latter case, a very compact multi-beamlet generation- and correction-assembly 120 can be provided.

For example, each of the plurality of beamlets 12 may be deflected individually by the plurality of multipoles 123, such that the plurality of beamlets appear to come from different sources. According to another example, spherical aberrations or higher order aberrations of the plurality of beamlets may be individually compensated with the plurality of multipoles 123.

The charged particle beam apparatus 100 further includes an objective lens 150 for focusing the plurality of beamlets 12 to separate locations on the specimen 10. In some embodiments, the objective lens 150 may include a combined magnetic-electrostatic objective lens including a magnetic lens portion and an electrostatic lens portion.

A retarding field electrode may be provided which is configured to reduce the landing energy of the charged particles on the specimen. For example, a retarding field electrode may be arranged upstream of the specimen for decelerating the electrons of the plurality of beamlets from an energy of, e.g., 30 keV or more, to a landing energy of, e.g., 10 keV or less, or even 5 keV or less.

A main feature of the charged particle beam apparatus 100 described herein is the transfer lens for beamlet collimation arranged between the multi-beamlet generation- and correction-assembly 120 and the objective lens 150. In other words, the plurality of beamlets 12 are collimated by the transfer lens, such that essentially collimated beamlets propagate from the single transfer lens 130 to the objective lens 150.

The transfer lens may be a single transfer lens 130. A "single" transfer lens can be understood as referring to one single lens for beam collimation, which is different from a transfer lens array of two or more transfer lenses arranged one after the other along the optical axis A with an intermediate beamlet crossover arranged therebetween. Transfer lens arrays with two or more subsequent lenses lead to an increased length of the beamlet propagation path and, hence, increase the electron-electron-interaction between adjacent beamlets. Since, according to implementations described herein, one single transfer lens for beamlet collimation is provided, the beam path can be shortened and negative effects of e-e-interaction between adjacent beamlets can be reduced. Further, a compact charged particle beam apparatus can be provided.

Providing the single transfer lens 130 for beamlet collimation between the (optionally curved) intermediate focus plane X1 and the objective lens 150 is beneficial for several reasons: A collimation upstream of the objective lens 150 by the single transfer lens 130 leads to a decreased beamlet diameter at the position of the objective lens, such that aberrations introduced by the objective lens can be reduced. Further, the focusing effect that is needed by the objective lens can be reduced when the objective lens acts on collimated beamlets, which further reduces aberrations introduced by the objective lens. The working distance can be reduced and hence the obtainable resolution is increased. Beam-optical components arranged between the single transfer lens 130 and the objective lens 150, such as a beam separator assembly 140, act on essentially collimated beamlets which facilitates alignment and reduces the risk of beam aberrations. Further, the space is increased that is available for separating signal particles 13 from the plurality of beamlets 12, improving the detection efficiency and therefore the signal strength.

According to embodiments described herein, each of the plurality of beamlets 12 may have one single intermediate crossover between the multi-beamlet generation- and correction-assembly 120 and the objective lens 150, which is different from two or more intermediate beam crossovers, said single intermediate beamlet crossover being arranged in the (optionally curved) intermediate focus plane X1. Providing a beam path with one single intermediate crossover provides several advantages: Electron-electron interaction is particularly strong at the positions of beam crossovers, such that it is beneficial to reduce the number of beamlet crossovers upstream of the beamlet focus on the specimen. Further, a beam propagation path that includes several intermediate crossovers is longer than a beam path with only one intermediate crossover, and the electron-electron interaction between adjacent beamlets can be reduced by using a beam propagation path that is as short as possible.

According to embodiments described herein, a compact multi-beam inspection apparatus is provided that allows the quick inspection of a specimen at a good resolution. The multi-beamlet generation- and correction-assembly 120 provides a field curvature correction of the plurality of generated beamlets, and in addition allows a beamlet deflection and/or correction. The single transfer lens 130 for beamlet collimation reduces aberrations introduced by the objective lens and improves the detection efficiency, while at the same time maintaining a compact apparatus with a reduced e-e-interaction length as compared to systems with a plurality of transfer lenses and/or intermediate beamlet crossovers.

In some implementations, the single transfer lens 130 may be arranged downstream of the plurality of intermediate beamlet crossovers at a first distance D1 therefrom, wherein the first distance D1 essentially corresponds to the focal length of the single transfer lens 130. If the intermediate crossover plane X1 is curved, the first distance D1 may be considered as the average distance between the intermediate crossovers and the single transfer lens 130. The first distance D1 may be 150 mm or less in some embodiments, particularly 130 mm or less, e.g. about 120 mm. Each of the plurality of beamlets 12 can be approximately collimated by the single transfer lens 130.

In some embodiments, the single transfer lens 130 is a magnetic lens or includes at least a magnetic lens part that is optionally at least partially surrounded by a magnetic field shielding.

In some embodiments, which can be combined with other embodiments described herein, the plurality of multipoles 123 is a plurality of quadrupoles, hexapoles, octupoles or even higher order multipoles, e.g. 12-poles or 16-poles. The plurality of multipoles may be configured for at least one of individual beamlet correction and individual beamlet adjustment or deflection. Each multipole of the plurality of multipoles 123 may include a plurality of electrodes, e.g., eight electrodes. In some embodiments, the multipoles are electrostatic multipoles, and each electrode may be provided as a conductive body.

The plurality of multipoles 123 may be formed integrally with one of the multi-aperture electrodes. For example, the plurality of multipoles 123 may be arranged on a surface of one of the multi-aperture electrodes, such that the electrodes of each multipole surround a respective aperture of the plurality of apertures of the multi-aperture electrode at evenly distributed angular positions. Two electrodes of each multipole are schematically depicted in the sectional view of FIG. 1.

As is schematically depicted in FIG. 1, the charged particle beam apparatus 100 further includes a beam separator assembly 140 for separating signal particles 13 from the plurality of beamlets 12, the beam separator assembly 140 arranged between the single transfer lens 130 and the objective lens 150. The beam separator assembly 140 may include at least one magnetic deflector configured for generating a magnetic field in a direction transverse to the optical axis A, such that the signal particles 13 that propagate through the beam separator assembly 140 in an essentially opposite direction as compared to the plurality of beamlets 12 can be extracted toward a charged particle detector 180.

In some embodiments, which can be combined with other embodiments described herein, the single transfer lens 130 is configured to direct the plurality of beamlets 12 through an essentially coma-free point (C) of the objective lens 150. In other words, while the single transfer lens 130 collimates the plurality of beamlets 12 individually, the single transfer lens 130 causes a mutual approximation of the plurality of beamlets 12 toward each other, such that the plurality of beamlets propagate essentially through the same central area of the objective lens where "comatic" aberrations are reduced or completely avoided. "Coma" refers to a beam aberration introduced by the objective lens that increases with the distance of the respective beamlet from the optical axis A in the objective lens. If each of the plurality of beamlets is directed through the coma-free point C of the objective lens (which is essentially through a central area of the objective lens bore), aberrations are further reduced and the resolution is improved.

According to some embodiments, the single transfer lens 130 may be used for directing the plurality of beamlets 12 to the coma free point C of the objective lens. Alternatively or additionally, a deflector array (such as the plurality of multipoles 123) may be used in some embodiments for fine adjustment of the individual beamlets, especially for the fine adjustment of the plurality of beamlets to be guided into or through the coma free point of the objective lens. The single transfer lens (and the deflector array, if any) being configured for guiding the plurality of beamlets to the coma free point of the objective lens may be understood in that the focal length of the single transfer lens, the voltage supplied to the single transfer lens, the voltage supplied to the deflector array, the size of the deflector array, the size of the single deflectors of the deflector arrays may be chosen for guiding the plurality of beamlets to the coma free point C of the objective lens. The charged particle beam apparatus may include a controller for controlling the operational parameters of the transfer lens and the deflector array, if any (e.g. a controller being connected or integrated in a feedback loop or a monitoring device for monitoring the operation of the charged particle beam apparatus).

As used throughout the present disclosure, the term "coma-free plane" or "coma-free point" refers to a plane or a point of the objective lens at which minimum or even no coma is introduced in the plurality of beamlets when the beamlets pass through the coma-free point or coma-free plane. The coma-free point or coma-free plane of the objective lens is a point or plane of the objective lens at which the Fraunhofer condition (condition that the coma is zero) is nearly or exactly satisfied. The coma-free point or coma-free plane of the objective lens may be located on the optical axis A of the charged particle beam apparatus at the position of the objective lens. The coma-free point or coma-free plane can be positioned within the objective lens. As an example, the coma-free point or coma-free plane can be surrounded by the objective lens.

According to some embodiments described herein, the guidance of the plurality of beamlets through the coma-free point of the objective lens may be combined with any embodiment described herein. For instance, a charged particle beam apparatus may be provided having the multi-beamlet generation- and correction-assembly as described above and having an architecture with a single transfer lens and/or deflector module(s) to guide the beamlets through the coma-free point of the objective lens.

In some embodiments, which can be combined with other embodiments described herein, the objective lens 150 is configured to focus each of the plurality of beamlets to a separate location on the specimen, particularly with a pitch of 20 µm or more and 50 µm or less between two adjacent separate locations, respectively. In particular, the pitch between adjacent locations may be 20 µm or more and 30 µm or less. Specifically, the plurality of beamlets may be focused to an array of inspection locations in the specimen plane, the array of inspection locations having a distance between 20 µm and 30 µm between two adjacent locations that are inspected. For example, the array of inspection locations may include a (sub-)array of 5 (or more)×5 (or more) inspection locations with a distance of about 25 µm between two adjacent locations in two perpendicular directions in the x-y-plane which is the specimen plane.

In some embodiments, which can be combined with other embodiments described herein, a condenser lens 110 is provided for beam collimation upstream of the multi-beamlet generation- and correction-assembly 120. Optionally, a distance D5 between the condenser lens 110 and the multi-beamlet generation- and correction-assembly 120 may be 5 cm or less, particularly 3 cm or less.

The condenser lens 110 may be a magnetic lens or may at least have a magnetic lens part in some implementations. In order to reduce or avoid a negative influence of the magnetic field of the condenser lens 110 on the multi-beamlet generation- and correction-assembly 120, a magnetic field shielding may be provided that partially or fully surrounds the condenser lens 110 and/or an area downstream of the condenser lens.

In some embodiments, which can be combined with other embodiments described herein, the first distance D1 between the plurality of intermediate beamlet crossovers and the single transfer lens 130 is 150 mm or less, particularly 120 mm or less. Alternatively or additionally, a second distance D2 between the single transfer lens 130 and the objective lens 150 may be 150 mm or less, particularly 120 mm or less. Alternatively or additionally, a third distance between the charged particle beam emitter 105 and the multi-beamlet generation- and correction-assembly 120 may be 150 mm or less, particularly 120 mm or less, or even 100 mm or less. The above three distances may be provided in combination, which leads to a very compact multi-beamlet charged particle apparatus with a decreased length of electron-electron interaction between adjacent beamlets. Accordingly aberrations can be reduced and the resolution can be improved.

A short second distance D2 between the single transfer lens 130 and the objective lens 150 is beneficial because the e-e-interaction between adjacent beamlets increases in a downstream direction in said section toward the coma-free point C of the objective lens. The use of a single transfer lens 130 that does not introduce or cause an additional beamlet crossover in said section allows the plurality of beamlets to be directed to the coma-free point C of the objective lens while keeping the negative effects of the e-e-interaction low.

FIG. 2 is a schematic view of a multi-beamlet assembly 101 for use in a charged particle beam apparatus according to embodiments described herein, particularly for use in the charged particle beam apparatus 100 of FIG. 1.

The multi-beamlet assembly 101 includes a field curvature corrector having a plurality of apertures of varying diameters for a plurality of beamlets 12 of charged particles, the field curvature corrector configured to focus each of the plurality of beamlets to provide a plurality of intermediate beamlet crossovers downstream of the field curvature corrector, particularly in an intermediate crossover plane X1. The intermediate crossover plane X1 may optionally be a curved plane, if field curvature is pre-compensated by the field curvature corrector. The field curvature corrector may have at least one multi-aperture electrode (e.g., the at least one second multi-aperture electrode 122) with a plurality of apertures of varying diameters. In particular, the aperture diameters may vary as a function of a distance from the optical axis A, particularly decreasing from the optical axis A in a radial direction.

The field curvature corrector may be a part of a multi-beamlet generation- and correction-assembly as described above with respect to FIG. 1. Specifically, the multi-beamlet generation- and correction-assembly may include two, three, four or more multi-aperture electrodes and optionally a plurality of multipoles for individually influencing each of the plurality of beamlets.

The multi-beamlet assembly 101 further includes a single transfer lens 130 for beamlet collimation arranged downstream of the plurality of intermediate beamlet crossovers, and an objective lens 150 for focusing each beamlet of the plurality of beamlets to a separate location on a specimen. In some embodiments, each of the plurality of beamlets may have one single intermediate beamlet crossover between the field curvature corrector and the objective lens. A compact multi-beamlet assembly 101 can be provided and the electron-electron-interaction can be reduced.

The single transfer lens 130 may be configured to direct the plurality of beamlets 12 through an essentially coma-free point C of the objective lens.

The multi-beamlet assembly 101 may be configured for a two-dimensional array of beamlets, for example an array of 40 or more and 130 or less beamlets that may optionally be arranged in a plurality of rows.

The multi-beamlet assembly 101 may further include any of the features described above, such that reference can be made to the embodiment depicted in FIG. 1, and details are not repeated here.

FIG. 3 is a schematic view of a charged particle beam apparatus 200 for inspecting a specimen 10 with a plurality of beamlets 12 according to embodiments described herein. The charged particle beam apparatus 200 may include some features or all the features of the charged particle beam apparatus 100 of FIG. 1, such that reference can be made to the above explanations, which are not repeated here.

The charged particle beam apparatus 200 includes a charged particle beam emitter 105 for generating a charged particle beam 11 propagating along an optical axis A, and a multi-beamlet generation- and correction-assembly 120 as described above.

A condenser lens 110 for beam collimation may be arranged between the charged particle beam emitter 105 and the multi-beamlet generation- and correction-assembly 120, such that an essentially collimated charged particle beam enters the first plurality of apertures of the first multi-aperture electrode 121.

The condenser lens 110 may be a magnetic lens or may at least include a magnetic lens part, and the distance D5 between the condenser lens and the multi-beamlet generation- and correction-assembly may be 5 cm or less, particularly 3 cm or less. In order to reduce or avoid an interaction of the magnetic field of the condenser lens 110 with the multi-beamlet generation- and correction-assembly 120, a first magnetic field shielding 201 may be provided. The first magnetic field shielding 201 may at least partially surround the condenser lens 110 and/or an area downstream of the condenser lens 110, such that the magnetic field of the condenser lens is reduced or cut off downstream of the condenser lens. For example, the first magnetic field shielding 201 may have the form of a tubular magnetic shielding that partially surrounds the condenser lens and/or the area directly downstream of the condenser lens. In some embodiments, the first magnetic field shielding 201 may include a mu-metal shielding or a shielding with another "soft" magnetic material with a high relative permeability.

As is schematically depicted in FIG. 3, the multi-beamlet generation- and correction-assembly 120 may include a first multi-aperture electrode 121 with a first plurality of apertures for beamlet generation, at least one second multi-aperture electrode 122 with a second plurality of apertures of varying diameters for providing a field curvature correction, and optionally a third multi-aperture electrode 124 with a third plurality of apertures downstream of the second multi-aperture electrode. The first and the third multi-aperture electrode may be provided on the same electric potential, particularly on a ground potential.

When the first multi-aperture electrode 121 and the third multi-aperture electrode 124 are grounded, the multi-beamlet generation- and correction-assembly 120 has essentially the effect of an array of Einzel lenses which focus the plurality of beamlets without changing the energy of the beamlets. Accordingly, the charged particles entering and exiting the multi-beamlet generation- and correction-assembly 120 essentially have the same energy, which may for example be 30 keV or more. In some embodiments, the multi-beamlet generation- and correction-assembly 120 may have more than three multi-aperture electrodes.

The multi-beamlet generation- and correction-assembly 120 may further include the plurality of multipoles 123 for individually influencing each of the plurality of beamlets. The plurality of multipoles 123 may be a plurality of electrostatic octupoles, one octupole for each of the plurality of beamlets, such that each beamlet can be individually deflected, adjusted and/or corrected at a position directly downstream of the multi-aperture electrodes.

In some embodiments, a beamlet blanker array 250 may be arranged between the multi-beamlet generation- and correction-assembly 120 and the single transfer lens 130, particularly at or near the plurality of intermediate beamlet crossovers. The beamlet blanker array 250 allows blocking of a selectable subset of the plurality of beamlets while allowing another subset of the plurality of beamlets to pass toward the single transfer lens. The beamlet blanker array 250 may include a plurality of blanking dipoles, one dipole for each of the plurality of beamlets, as well as a controller for selecting a predetermined passing-subset and a predetermined blocking-subset of beamlets.

The single transfer lens 130 may be arranged at a first distance D1 downstream of the plurality of intermediate beamlet crossovers, the first distance essentially corresponding to the focal length of the single transfer lens 130. Accordingly, the plurality of beamlets is collimated by the single transfer lens 130. In some implementations, the single transfer lens 130 may be a magnetic lens or may at least include a magnetic lens part.

Optionally, a second magnetic field shielding 202 may be provided that at least partially surrounds the single transfer lens 130 and/or an area downstream of the single transfer lens 130, such that the magnetic field of the single transfer lens 130 is reduced or cut off downstream of the condenser lens 110. For example, the second magnetic field shielding 202 may have the form of a tubular magnetic shielding that partially surrounds the single transfer lens and/or an area directly downstream of the single transfer lens. In some embodiments, the second magnetic field shielding 202 may include a mu-metal shielding or a shielding with another "soft" magnetic material with a high relative permeability. If a beam separator assembly 240 or another beam-optical component is arranged at a close distance downstream of the single transfer lens 130, the second magnetic field shielding 202 may reduce or prevent a negative effect of the magnetic field of the single transfer lens 130 on the beam separator assembly 240 or the other beam-optical component.

The plurality of beamlets 12 may be directed through the essentially coma-free point C of the objective lens 150, and the objective lens 150 may be configured to focus each of the plurality of beamlets to a separate location on the specimen.

Signal particles 13 generated upon impingement of the plurality of beamlets 12 on the specimen may be separated from the plurality of beamlets 12 and may be directed toward a particle detector 180 by a beam separator assembly 240. The beam separator assembly 240 may be arranged between the single transfer lens 130 and the objective lens 150. The generated signal particles may propagate through the objective lens 150 and may be directed away from the optical axis A by the beam separator assembly 240. Optionally, a beam bender may be provided for directing the signal particles 13 toward the charged particle detector 180.

In some embodiments, which can be combined with other embodiments described herein, the beam separator assembly 240 is configured to cause an essentially parallel shift of the optical axis A of the charged particle beam apparatus by bending a propagation direction of each of the plurality of beamlets in opposite directions at two subsequent positions. In particular, each of the plurality of beamlets may have a respective first propagation direction upstream of the beam separator assembly 240 and a respective second propagation direction downstream of the beam separator assembly 240 that is shifted relative to the respective first propagation direction. Shifting the optical axis A with the beam separator assembly 240 may be beneficial because the signal particles can be more easily and more reliably separated from the plurality of beamlets and the detection efficiency can be improved.

In some implementations, the beam separator assembly 240 includes a beam separator 241 having a first dispersion for separating the signal particles 13 from the plurality of beamlets 12. The beam separator 241 may be a magnetic beam separator, particularly a purely magnetic beam separator. The beam separator 241 may be arranged at a close distance upstream of the objective lens 150, e.g. at a distance of 3 cm or less. For example, the beam separator 241 may be at least partially immersed in a body of the objective lens 150, e.g. located at least partially within a bore of the objective lens, or may be located directly upstream of the bore of the objective lens. In some embodiments, a beam scanner (not depicted in FIG. 3) may additionally be arranged between the beam separator 241 and a lens gap of the objective lens 150.

The beam separator 241 may be configured to generate a magnetic field in a direction transverse to the propagation direction of charged particles therethrough, such that the plurality of beamlets 12 and the signal particles 13 are deflected. Since the signal particles 13 and the plurality of beamlets 12 propagate through the beam separator 241 in essentially opposite directions, the signal particles 13 are separated from the plurality of beamlets 12. Using a purely magnetic deflector as the beam separator 241 has the advantage that the region inside the objective lens 150 can be kept free of parts that need intensive servicing. The electron-electron interaction length can be further reduced.

The beam separator 241 has a first dispersion, which means that the beam separator 241 acts on charged particles propagating therethrough in dependence of the charged particle energy, i.e., electrons are deflected by a deflection angle which depends on the electron energy.

In some embodiments, the beam separator assembly 240 may further include a dispersion compensation element 242 having a second dispersion that is arranged upstream of the beam separator 241. The second dispersion may essentially compensate the first dispersion of the beam separator 241, such that the beam separator assembly 240 in entirety does not introduce chromatic aberrations.

The dispersion compensation element 242 may be adapted for adjusting the second dispersion independently of a beam inclination angle provided by the dispersion compensation element 242. In particular, the dispersion compensation element 242 may allow adjusting the second dispersion such that the second dispersion essentially compensates the first dispersion of the beam separator 241 such as to give a zero or substantially reduced chromatic aberration, or alternatively to adjust the net dispersion of the beam separator assembly 240 to an appropriate value. At the same time, a beam deflection angle caused by the dispersion compensation element 242 can be maintained such as to inversely correspond to a beam deflection angle caused by the beam separator 241. Accordingly, the beam separator assembly 240 may cause an essentially parallel shift of the optical axis A of the charged particle beam apparatus, since the plurality of beamlets are deflected subsequently two times in mutually opposite directions by essentially corresponding angles.

The dispersion compensation element 242 may be arranged directly downstream of the single transfer lens 130 at a fourth distance D4 therefrom. The fourth distance D4 may be 5 cm or less, particularly 3 cm or less. If the fourth distance D4 is small, it is beneficial to provide the second magnetic field shielding 202 that reduces or avoids a magnetic field of the single transfer lens 130 at the position of the dispersion compensation element 242. A very compact charged particle beam apparatus with a reduced e-e-interaction length can be provided.

In some implementations, the beam separator 241 may be a first magnetic deflector, and/or the dispersion compensation element 242 may include a first deflector and a second deflector for generating deflection fields superimposed on each other, the first and second deflector having mutually opposite deflection directions. The first deflector may be a second magnetic deflector 243 and the second deflector may be an electrostatic deflector 244, both deflectors being adapted to deflect the plurality of beamlets in the same deflection plane. The second magnetic deflector 243 and the electrostatic deflector 244 may be connected to a control apparatus that allows choosing the deflection angle of the dispersion compensation element 242 to have equal magnitude and opposite sign as compared to the deflection angle of the first magnetic deflector of the beam separator 241.

Figure 4:
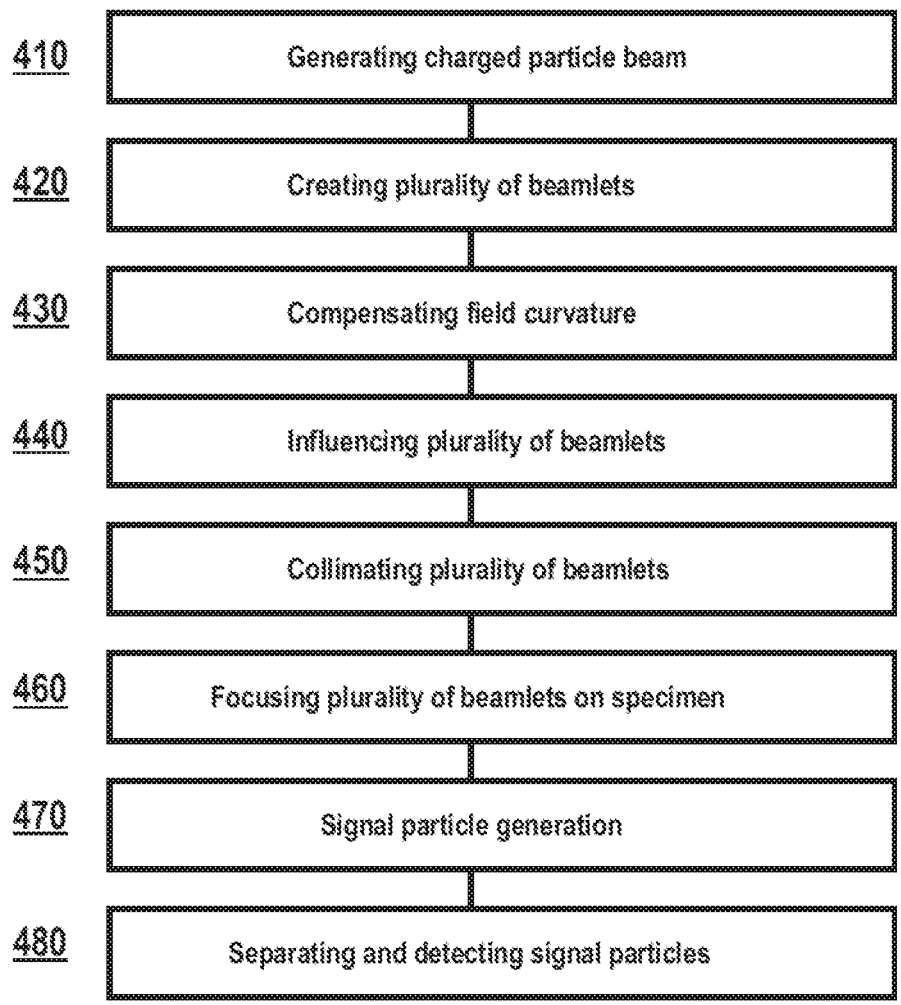
FIG. 4 shows a flow chart of a method of inspecting a specimen with a plurality of beamlets of charged particles according to embodiments described herein.

FIG. 4 is a flow diagram that illustrates a method of inspecting a specimen with a plurality of beamlets of charged particles according to embodiments described herein.

In box 410, a charged particle beam, particularly an electron beam, is generated. The charged particle beam propagates along an optical axis A. The charged particle beam may be generated by a thermal field emitter (TFE) or by a cold field emitter (CFE).

In box 420, a plurality of beamlets is created from the charged particle beam. In particular, the plurality of beamlets may be created by passing the charged particle beam through a first plurality of apertures, e.g. of a multi-aperture plate, that split the charged particle beam into the plurality of beamlets.

In box 430, a field curvature is (pre-)compensated by focusing the plurality of beamlets with a multi-aperture electrode having a plurality of apertures of varying diameters. The field curvature caused by one or more beam-optical components of the group consisting of a condenser lens, a transfer lens and an objective lens may be (pre-)compensated. The plurality of beamlets may be focused to provide a plurality of intermediate beamlet crossovers in an intermediate cross-over plane X1 (that may optionally be a curved plane).

In box 440, the plurality of beamlets is individually influenced with a plurality of multipoles, e.g., electrostatic octupoles. For example, each of the plurality of beamlets may be at least one of deflected, adjusted, and corrected.

In box 450, the plurality of beamlets is collimated with a single transfer lens arranged downstream of the plurality of intermediate beamlet crossovers.

In box 460, the plurality of beamlets is focused on separate locations of the specimen with an objective lens to simultaneously inspect the specimen at the separate locations.

The plurality of beamlets may optionally be directed through an essentially coma-free point of the objective lens.

In box 470, signal particles (secondary particles and/or backscattered particles) may be generated at the separate locations of the specimen. In particular, each of the plurality of beamlets may generate a respective beam of signal particles that may propagate through the objective lens in an opposite direction as compared to the propagation direction of the plurality of beamlets.

In box 480, the signal particles may be separated from the plurality of beamlets by a beam separator assembly and may be directed to a particle detector. The particle detector may be a segmented detector that may include at least one detection segment for each beam of signal particles. Accordingly, a plurality of locations of the specimen can be simultaneously inspected by the plurality of beamlets.

The beam separator assembly may be arranged between the single transfer lens and the objective lens. The plurality of beamlets may have a respective first propagation direction upstream of the beam separator assembly and a respective second propagation direction downstream of the beam separator assembly that may be shifted essentially parallel relative to the respective first propagation direction. Accordingly, the beam separator assembly may cause an essentially parallel shift of each of the plurality of beamlets which means that the optical axis upstream of the beam separator assembly may be shifted relative to the optical axis downstream of the beam separator assembly.

Embodiments described herein relate to a compact multi-beamlet charged particle apparatus that provides a high throughput and good resolution. This is achieved by one or more of the following features, particularly by the following features in combination: (1) single transfer lens; (2) single intermediate beamlet crossover; (3) field curvature corrector providing intermediate beamlet crossover; (4) beam separator that causes a parallel shift of the optical axis; (5) directing the plurality of beamlets through the coma-free point of the objective lens; (6) small distance between the single transfer lens and the objective lens; (7) small distance between the single transfer lens and the beam separator in combination with a magnetic field shielding; (8) small distance between the condenser lens and the multi-beamlet generation- and correction-assembly in combination with a magnetic field shielding.

The present disclosure provides a plurality of embodiments. Exemplary embodiments are listed below. Embodiment 1. A charged particle beam apparatus (100) for inspecting a specimen (10) with a plurality of beamlets (12) of charged particles, comprising: a charged particle beam emitter (105) for generating a charged particle beam (11) propagating along an optical axis (A); a multi-beamlet generation- and correction-assembly (120), comprising: a first multi-aperture electrode (121) with a first plurality of apertures for creating the plurality of beamlets from the charged particle beam; at least one second multi-aperture electrode (122) with a second plurality of apertures of varying diameters for the plurality of beamlets for providing a field curvature correction; and a plurality of multipoles (123) for individually influencing each of the plurality of beamlets, wherein the multi-beamlet generation- and correction-assembly (120) is configured to focus the plurality of beamlets to provide a plurality of intermediate beamlet crossovers, the charged particle beam apparatus further comprising: an objective lens (150) for focusing each of the plurality of beamlets to a separate location on the specimen; and a single transfer lens (130) for beamlet collimation arranged between the multi-beamlet generation- and correction-assembly and the objective lens.

Embodiment 2. The charged particle beam apparatus according to embodiment 1, wherein the plurality of multipoles (123) is a plurality of electrostatic octupoles configured for at least one of individual beamlet correction and individual beamlet adjustment.

Embodiment 3. The charged particle beam apparatus according to embodiment 1 or 2, wherein the single transfer lens (130) is arranged downstream of the plurality of intermediate beamlet crossovers at a first distance (D1) therefrom, the first distance (D1) essentially corresponding to a focal length of the single transfer lens (130).

Embodiment 4. The charged particle beam apparatus according to any of embodiments 1 to 3, further comprising a beam separator assembly (140, 240) for separating signal particles (13) from the plurality of beamlets (12), the beam separator assembly arranged between the single transfer lens and the objective lens.

Embodiment 5. The charged particle beam apparatus according to embodiment 4, wherein the beam separator assembly (240) is configured to cause an essentially parallel shift of the optical axis (A) of the charged particle beam apparatus by bending a propagation direction of each of the plurality of beamlets in essentially opposite directions at two subsequent positions.

Embodiment 6. The charged particle beam apparatus according to embodiment 4 or 5, wherein the beam separator assembly (240) comprises a beam separator (241) having a first dispersion for separating the signal particles from the plurality of beamlets and a dispersion compensation element (242) having a second dispersion upstream of the beam separator (241), the dispersion compensation element adapted for adjusting the second dispersion independently of a beam inclination angle caused by the dispersion compensation element.

Embodiment 7. The charged particle beam apparatus according to embodiment 6, wherein the beam separator (241) is a first magnetic deflector; and/or the dispersion compensation element (242) comprises a first deflector and a second deflector having mutually opposite deflection directions, particularly a second magnetic deflector (243) and an electrostatic deflector (244).

Embodiment 8. The charged particle beam apparatus according to any of embodiments 1 to 7, wherein the single transfer lens (130) is configured to direct the plurality of beamlets through an essentially coma-free point (C) of the objective lens (150).

Embodiment 9. The charged particle beam apparatus according to any of embodiments 1 to 8, wherein the objective lens (150) is configured to focus each of the plurality of beamlets to a separate location on the specimen with a pitch of 20 µm or more and 50 µm or less between two adjacent separate locations, respectively, particularly wherein the separate locations form a two-dimensional array of inspection points on the specimen.

Embodiment 10. The charged particle beam apparatus according to any of embodiments 1 to 9, further comprising a condenser lens (110) for beam collimation upstream of the multi-beamlet generation- and correction-assembly (120), particularly wherein a distance (D5) between the condenser lens and the multi-beamlet generation- and correction-assembly is 5 cm or less, particularly 3 cm or less.

Embodiment 11. The charged particle beam apparatus according to embodiment 10, wherein at least one of the condenser lens (110) and the single transfer lens (130) is a magnetic lens, the charged particle beam apparatus further comprising at least one of a first magnetic field shielding (201) that partially or fully surrounds the condenser lens (110) and/or an area downstream of the condenser lens (110) and a second magnetic field shielding (202) that partially or fully surrounds the single transfer lens (130) and/or an area downstream of the single transfer lens (130).

Embodiment 12. The charged particle beam apparatus according to embodiment 11, wherein at least one of the first magnetic field shielding (201) and the second magnetic field shielding (202) comprises a mu-metal.

Embodiment 13. The charged particle beam apparatus according to any of embodiments 1 to 12, further comprising a beamlet blanker array (250) arranged between the multi-beamlet generation- and correction-assembly (120) and the single transfer lens (130), particularly at or near the plurality of intermediate beamlet crossovers.

Embodiment 14. The charged particle beam apparatus according to any of embodiments 1 to 13, wherein a first distance (D1) between the plurality of intermediate beamlet crossovers and the single transfer lens (130) is about 150 mm or less, a second distance (D2) between the single transfer lens and the objective lens (150) is 150 mm or less, and/or a third distance (D3) between the charged particle beam emitter (105) and the multi-beamlet generation- and correction-assembly (120) is 150 mm or less.

Embodiment 15. The charged particle beam apparatus according to any of embodiments 1 to 14, wherein the charged particle beam apparatus is configured to provide one single intermediate crossover of each of the plurality of beamlets before impingement on the specimen.

Embodiment 16. A multi-beamlet assembly for use in a charged particle beam apparatus, particularly according to any of embodiments 1 to 15, comprising: a field curvature corrector having a plurality of apertures of varying diameters for a plurality of beamlets of charged particles, the field curvature corrector configured to focus each of the plurality of beamlets to provide a plurality of intermediate beamlet crossovers; a single transfer lens (130) for beamlet collimation arranged downstream of the plurality of intermediate beamlet crossovers; and an objective lens (150) for focusing each beamlet of the plurality of beamlets to a separate location on a specimen.

Embodiment 17. A method of inspecting a specimen with a plurality of beamlets of charged particles in a charged particle beam apparatus, comprising: generating a charged particle beam propagating along an optical axis (A); creating the plurality of beamlets from the charged particle beam; compensating a field curvature by focusing the plurality of beamlets with a multi-aperture electrode having a plurality of apertures with varying diameters; individually influencing the plurality of beamlets with a plurality of multipoles; collimating the plurality of beamlets with a single transfer lens; and focusing the plurality of beamlets on separate locations of the specimen with an objective lens to simultaneously inspect the specimen at the separate locations.

Embodiment 18. The method of embodiment 17, wherein the single transfer lens directs the plurality of beamlets through an essentially coma-free point (C) of the objective lens (150).

Embodiment 19. The method of embodiment 17 or 18, further comprising separating signal particles from the plurality of beamlets with a beam separator assembly arranged between the single transfer lens and the objective lens, wherein the plurality of beamlets have a respective first propagation direction upstream of the beam separator assembly and a respective second propagation direction downstream of the beam separator assembly that is shifted essentially parallel relative to the respective first propagation direction.

Embodiment 20. The method of any of embodiments 17 to 19, wherein creating the plurality of beamlets comprises creating a 2-dimensional array of beamlets, particularly a number of 40 or more and 130 or less beamlets.

While the foregoing is directed to embodiments, other and further embodiments may be devised without departing from the basic scope thereof, and the scope thereof is determined by the claims that follow.

The invention claimed is:

1. A charged particle beam apparatus for inspecting a specimen with a plurality of beamlets of charged particles, comprising:
   a charged particle beam emitter for generating a charged particle beam propagating along an optical axis (A);
   a multi-beamlet generation- and correction-assembly, comprising:
      a first multi-aperture electrode with a first plurality of apertures for creating the plurality of beamlets from the charged particle beam;
      at least one second multi-aperture electrode with a second plurality of apertures of varying diameters for the plurality of beamlets for providing a field curvature correction; and
      a plurality of multipoles for individually influencing each of the plurality of beamlets,
      wherein the multi-beamlet generation- and correction-assembly is configured to focus the plurality of beamlets to provide a plurality of intermediate beamlet crossovers, the charged particle beam apparatus further comprising:
   an objective lens for focusing each of the plurality of beamlets to a separate location on the specimen; and
   a single transfer lens for beamlet collimation arranged between the multi-beamlet generation- and correction-assembly and the objective lens, wherein the single transfer lens is configured to direct the plurality of beamlets through an essentially coma-free point (C) of the objective lens.

2. The charged particle beam apparatus according to claim 1, wherein the plurality of multipoles is a plurality of electrostatic octupoles configured for at least one of individual beamlet correction and individual beamlet adjustment.

3. The charged particle beam apparatus according to claim 1, further comprising a beam separator assembly for separating signal particles from the plurality of beamlets, the beam separator assembly arranged between the single transfer lens and the objective lens.

4. The charged particle beam apparatus according to claim 3, wherein the beam separator assembly is configured to cause an essentially parallel shift of the optical axis (A) of the charged particle beam apparatus by bending a propagation direction of each of the plurality of beamlets in opposite directions at two subsequent positions.

5. The charged particle beam apparatus according to claim 3, wherein the beam separator assembly comprises a beam separator having a first dispersion for separating the signal particles from the plurality of beamlets and a dispersion compensation element having a second dispersion upstream of the beam separator, the dispersion compensation element being adapted for adjusting the second dispersion independently of a beam inclination angle provided by the dispersion compensation element.

6. The charged particle beam apparatus according to claim 5, wherein
   the beam separator is a first magnetic deflector; and/or
   the dispersion compensation element comprises a first deflector and a second deflector having mutually opposite deflection directions, particularly a second magnetic deflector and an electrostatic deflector.

7. The charged particle beam apparatus according to claim 1, wherein the objective lens is configured to focus each of the plurality of beamlets to a separate location on the specimen with a pitch of 20 µm or more and 50 µm or less between two adjacent separate locations, respectively.

8. The charged particle beam apparatus according to claim 1, further comprising a beamlet blanker array arranged between the multi-beamlet generation- and correction-assembly and the single transfer lens.

9. The charged particle beam apparatus according to claim 1, wherein a first distance (D1) between the plurality of intermediate beamlet crossovers and the single transfer lens is 150 mm or less, a second distance (D2) between the single transfer lens and the objective lens is 150 mm or less, and a third distance (D3) between the charged particle beam emitter and the multi-beamlet generation- and correction-assembly is 150 mm or less.

10. The charged particle beam apparatus according to claim 1, wherein the charged particle beam apparatus is configured to provide one single intermediate crossover of each of the plurality of beamlets before impingement on the specimen.

11. A charged particle beam apparatus for inspecting a specimen with a plurality of beamlets of charged particles, comprising:
   a charged particle beam emitter for generating a charged particle beam propagating along an optical axis (A);
   a multi-beamlet generation- and correction-assembly, comprising:
      a first multi-aperture electrode with a first plurality of apertures for creating the plurality of beamlets from the charged particle beam;
      at least one second multi-aperture electrode with a second plurality of apertures of varying diameters for the plurality of beamlets for providing a field curvature correction; and
      a plurality of multipoles for individually influencing each of the plurality of beamlets,
      wherein the multi-beamlet generation- and correction-assembly is configured to focus the plurality of beamlets to provide a plurality of intermediate beamlet crossovers, the charged particle beam apparatus further comprising:
   an objective lens for focusing each of the plurality of beamlets to a separate location on the specimen; and
   a single transfer lens for beamlet collimation arranged between the multi-beamlet generation- and correction-assembly and the objective lens, wherein the single transfer lens is arranged downstream of the plurality of intermediate beamlet crossovers at a first distance (D1) therefrom, the first distance (D1) essentially corresponding to a focal length of the single transfer lens.

12. A charged particle beam apparatus for inspecting a specimen with a plurality of beamlets of charged particles, comprising:
a charged particle beam emitter for generating a charged particle beam propagating along an optical axis (A);
a multi-beamlet generation- and correction-assembly, comprising:
a first multi-aperture electrode with a first plurality of apertures for creating the plurality of beamlets from the charged particle beam;
at least one second multi-aperture electrode with a second plurality of apertures of varying diameters for the plurality of beamlets for providing a field curvature correction; and
a plurality of multipoles for individually influencing each of the plurality of beamlets,
wherein the multi-beamlet generation- and correction-assembly is configured to focus the plurality of beamlets to provide a plurality of intermediate beamlet crossovers, the charged particle beam apparatus further comprising:
an objective lens for focusing each of the plurality of beamlets to a separate location on the specimen;
a single transfer lens for beamlet collimation arranged between the multi-beamlet generation- and correction-assembly and the objective lens; and
a condenser lens for beam collimation upstream of the multi-beamlet generation- and correction-assembly, wherein a distance (D5) between the condenser lens and the multi-beamlet generation- and correction-assembly is 3 cm or less.

13. The charged particle beam apparatus according to claim 12, wherein at least one of the condenser lens and the single transfer lens is a magnetic lens, the charged particle beam apparatus further comprising at least one of a first magnetic field shielding that partially or fully surrounds the condenser lens and a second magnetic field shielding that partially or fully surrounds the single transfer lens.

14. The charged particle beam apparatus according to claim 13, wherein at least one of the first magnetic field shielding and the second magnetic field shielding comprises a mu-metal.

15. A multi-beamlet assembly for use in a charged particle beam apparatus, comprising:
a field curvature corrector having a plurality of apertures of varying diameters for a plurality of beamlets of charged particles, the field curvature corrector configured to focus each of the plurality of beamlets to provide a plurality of intermediate beamlet crossovers;
a single transfer lens for beamlet collimation arranged downstream of the plurality of intermediate beamlet crossovers; and
an objective lens for focusing each beamlet of the plurality of beamlets to a separate location on a specimen, wherein the single transfer lens is configured to direct the plurality of beamlets through an essentially coma-free point (C) of the objective lens.

16. A method of inspecting a specimen with a plurality of beamlets of charged particles in a charged particle beam apparatus, comprising:
generating a charged particle beam propagating along an optical axis (A);
creating the plurality of beamlets from the charged particle beam;
compensating a field curvature by focusing the plurality of beamlets with a multi-aperture electrode having a plurality of apertures with varying diameters;
individually influencing the plurality of beamlets with a plurality of multipoles;
collimating the plurality of beamlets with a single transfer lens; and
focusing the plurality of beamlets on separate locations of the specimen with an objective lens to simultaneously inspect the specimen at the separate locations, wherein the single transfer lens directs the plurality of beamlets through an essentially coma-free point (C) of the objective lens.

17. The method of claim 16, further comprising:
separating signal particles from the plurality of beamlets with a beam separator assembly arranged between the single transfer lens and the objective lens, wherein the plurality of beamlets have a respective first propagation direction upstream of the beam separator assembly and a respective second propagation direction downstream of the beam separator assembly that is shifted essentially parallel relative to the respective first propagation direction.

18. The method of claim 16, wherein creating the plurality of beamlets comprises creating a 2-dimensional array of forty or more beamlets.

* * * * *